(12) United States Patent
Park et al.

(10) Patent No.: US 10,014,071 B2
(45) Date of Patent: Jul. 3, 2018

(54) COMPARING TWICE-READ MEMORY CELL DATA FOR ERROR DETECTION IN A MEMORY DEVICE

(71) Applicant: SK hynix Inc., Gyeonggi-do (KR)

(72) Inventors: Min-Su Park, Gyeonggi-do (KR); Jae-Il Kim, Gyeonggi-do (KR); Tae-Kyun Kim, Gyeonggi-do (KR); Jun-Gi Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 159 days.

(21) Appl. No.: 15/066,773

(22) Filed: Mar. 10, 2016

(65) Prior Publication Data

US 2017/0068583 A1 Mar. 9, 2017

(30) Foreign Application Priority Data

Sep. 9, 2015 (KR) .................. 10-2015-0127462

(51) Int. Cl.
*G11C 29/08* (2006.01)
*G11C 11/406* (2006.01)
*G11C 11/4091* (2006.01)
*G11C 29/00* (2006.01)

(52) U.S. Cl.
CPC ............ *G11C 29/08* (2013.01); *G11C 11/406* (2013.01); *G11C 11/4091* (2013.01); *G11C 11/40611* (2013.01); *G11C 29/00* (2013.01)

(58) Field of Classification Search
CPC ..................................... G11C 29/08
See application file for complete search history.

(56) References Cited

U.S. PATENT DOCUMENTS

| 7,397,719 | B2 * | 7/2008 | Takahashi | ............. G11C 11/406 365/185.08 |
| 8,289,770 | B2 * | 10/2012 | Lee | ........... G11C 29/44 365/185.09 |
| 2008/0215939 | A1 * | 9/2008 | Ahn | ........... G11C 29/40 714/719 |
| 2017/0052840 | A1 * | 2/2017 | Kim | ........... G06F 11/0793 |

FOREIGN PATENT DOCUMENTS

| KR | 1020130117198 | 10/2013 |
| KR | 1020170023249 | 3/2017 |

* cited by examiner

*Primary Examiner* — Joseph R Kudirka
(74) *Attorney, Agent, or Firm* — IP & T Group LLP

(57) ABSTRACT

A memory device may include a plurality of memory cells; an error detection unit suitable for: latching data read a first time from at least one selected memory cell of the plurality of memory cells in a detection period, comparing data read a second time from the at least one selected memory cell with the latched data, and detecting an error of the at least one selected memory cell in the detection when the date read a second time from the at least one substantially the same with the latched data.

16 Claims, 7 Drawing Sheets

COMPARING TWICE-READ MEMORY CELL DATA FOR ERROR DETECTION IN A MEMORY DEVICE

CROSS-REFERENCE TO RELATED APPLICATIONS

The present application claims priority of Korean Patent Application No. 10-2015-0127462, filed on Sep. 9, 2015, which is incorporated herein by reference in its entirety.

BACKGROUND

1. Field

Exemplary embodiments of the present invention relate to a memory device.

2. Description of the Related Art

Memory devices may include a plurality of memory cells, each of which includes a cell transistor serving as a switch and a cell capacitor for storing a charge (data). Data of a memory cell may be determined as 'high' (logic 1) or 'low' (logic 0) depending on the charge stored in the cell capacitor of the memory cell, that is, whether a terminal voltage of the cell capacitor is high or low.

In principle, maintaining data stored in a memory cell as an accumulated charge in a cell capacitor, requires no power consumption. However, in practice, an initial charge stored in a cell capacitor may degrade overtime due to a leakage current caused, for example, near a PN junction of a MOS transistor, which in turn may cause a data loss. Furthermore, as the degree of integration of memory devices continues to increase and the width of line patterns (or critical dimension) decreases, the capacitance of a cell capacitor is reduced as compared with the capacitance of a bit line capacitor, so that a voltage difference for distinguishing data stored in the memory cell becomes smaller. As a result, there is an increased likelihood that a 1-bit failure occurs. Such 1-bit failure is commonly referred to as an intermittent tWR failure (hereinafter, also referred to as an intermittent failure).

An intermittent failure does not occur continuously in a specific cell but may occur rather irregularly, hence addressing such a failure may be problematic.

For example, a memory device such as a DRAM may perform a typical refresh operation on a constant cycle. Since an intermittent failure may occur during a refresh operation, it is difficult to prevent an intermittent failure through a typical refresh operation. Furthermore, even though a failed cell detected through a test in a production stage of a memory device may be repaired with a redundancy cell, it may be difficult to prevent an intermittent failure through conventional test and repair since an intermittent failure may also occur in a memory cell which is not detected as a failed cell.

SUMMARY

Various embodiments are directed to a memory device which detects and corrects intermittent failure of memory cells during its own operation.

In an embodiment, a memory device may include a plurality of memory cells; an error detection unit suitable for: latching data read a first time from at least one selected memory cell of the plurality of memory cells in a detection period, comparing data read a second time from the at least one selected memory cell with the latched data, and detecting an error of the at least one selected memory cell in the detection when the date read a second time from the at least one substantially the same with the latched data.

In another embodiment, a memory device may include: a refresh counter suitable for generating a refresh address; a detection counter suitable for generating row and column detection addresses; a flag signal generation unit suitable for generating a flag signal with a logic value which toggles in response to a refresh command in a detection period when the refresh address and the row detection address are substantially equal to each other; and an error detection unit suitable for latching data of memory cells, which are selected by the row and column detection addresses from the plurality of memory cells, in response to the refresh command when the flag signal has a first logic value and the refresh address and the row detection address are substantially equal to each other, and suitable for comparing the data of the selected memory cells with the latched data and detecting errors of the selected memory cells in response to the refresh command when the flag signal has a second logic value and the refresh address and the row detection address are substantially equal to each other.

In accordance with the present technology, intermittent fail of a memory cell is detected during an operation of a memory device and is corrected, so that it is possible to allow the memory device to normally operate even though the intermittent fall occurs.

DETAILED DESCRIPTION

Figure 1:
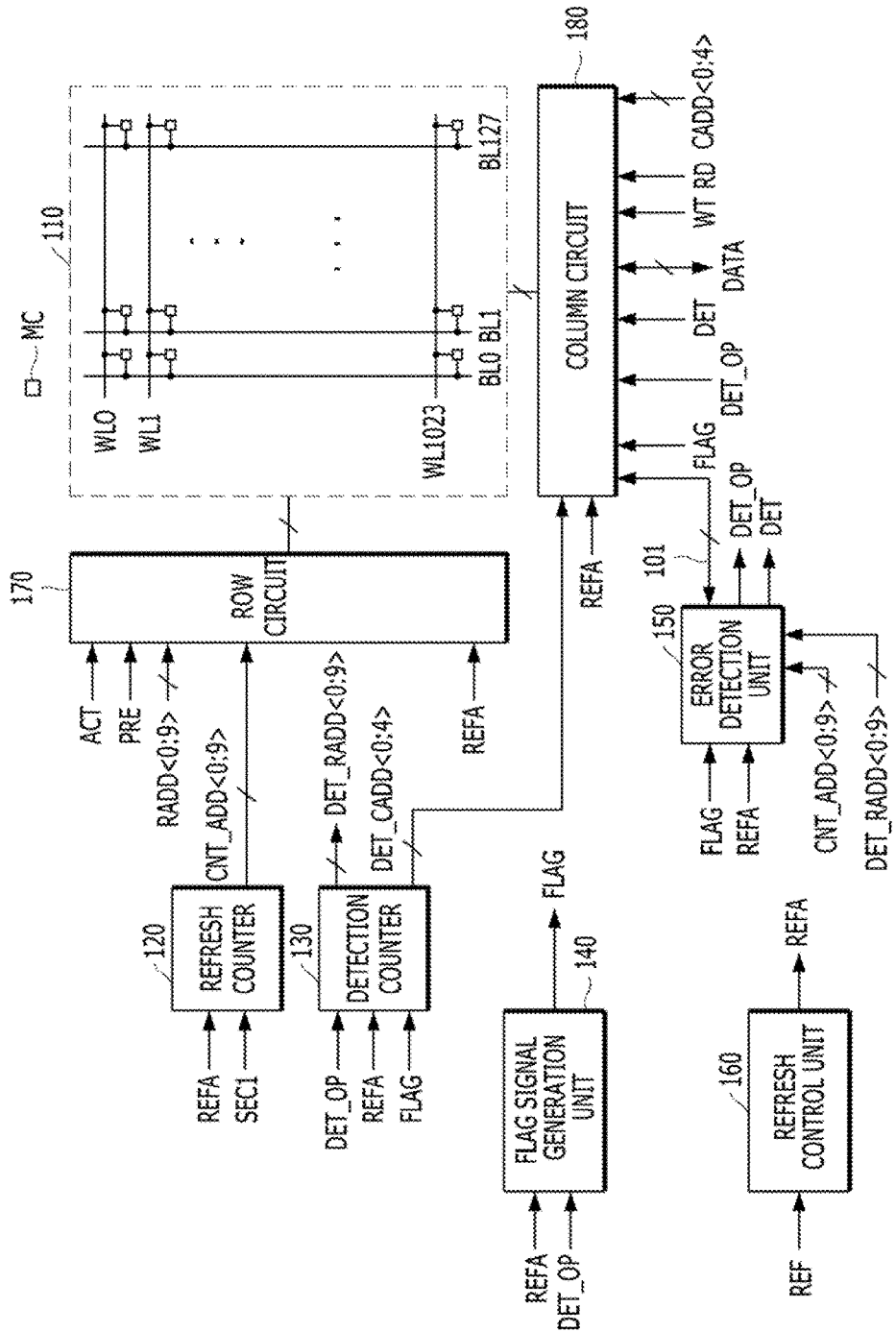
FIG. 1 is a configuration diagram of a memory device according to an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the invention to those skilled in the art. Throughout the disclosure, like reference numerals refer to like parts throughout the various figures and embodiments of the present invention.

Hereinafter, a detection operation may include detecting an intermittent failure of a memory device. A detection operation may further include correcting a detected intermittent failure of a memory device.

In an embodiment, a detection operation may include first and second sub-operations. A first sub-operation may include a first reading of data of one or more memory cells and latching the read data. The second sub-operation may include a second reading of the data of the same memory cells which were read during the first sub-operation, and comparing the read data from the second sub-operation with the latched data from the first sub-operation to detect an intermittent failure. The second sub-operation may further include correcting one or more memory cells for which an intermittent failure has been detected.

FIG. 1 is a configuration diagram of a memory device according to an embodiment of the present invention.

Referring to FIG. 1, the memory device may include a cell array 110, a refresh counter 120, a detection counter 130, a flag signal generation unit 140, an error detection unit 150, a refresh control unit 160, a row circuit 170, and a column circuit 180.

The cell array 110 may include a plurality of rows WL0 to WL1023 (word lines), a plurality of columns BL0 to BL127 (bit lines), and a plurality of memory cells MC coupled between the word lines and the bit lines. It is noted, that the number of rows, columns, and memory cells may vary.

The refresh counter 120 may perform a counting operation whenever a refresh signal REFA is activated. For example, the refresh counter may generate counting addresses CNT_ADD<0:9>, and may increase the counting addresses CNT_ADD<0:9> by 1 whenever the refresh signal REFA is activated. Increasing the counting addresses CNT_ADD<0:9> by 1 means that if, for example, a $K^{th}$ word line is selected this time, the counting addresses CNT_ADD<0:9> are changed so that a $K+1^{th}$ word line will be selected next time.

The detection counter 130 may generate row and column detection addresses DET_RADD<0:9>, DET_CADD<0:4> for selecting memory cells for performing a detection operation, from the plurality of memory cells MC of the cell array 110. Whenever a detection operation is completed, the detection counter 130 may increase the row detection addresses DET_RADD<0:9> or the column detection addresses DET_CADD<0:4>. When the row detection addresses DET_RADD<0:9> or the column detection addresses DET_CADD<0:4> reach an end value, the detection counter 130 may repeat the counting from an initial value. The completion of a detection operation may represent that first and second sub-operations have been sequentially completed once with respect to selected memory cells.

In an embodiment, whenever a detection operation is completed, the detection counter 130 may increase the column detection addresses DET_CADD<0:4>. When the detection operation is completed at the end value of the column detection addresses DET_CADD<0:4> (for example, a maximum value), the detection counter 130 may set the value of the column detection addresses DET_CADD<0:4> to an initial value (for example, a minimum value) and increase the row detection addresses DET_RADD<0:9>.

In a second embodiment, whenever a detection operation is completed, the detection counter 130 may increase the row detection addresses DET_RADD<0:9>. For example, when a detection operation is completed at the end value of the row detection addresses DET_RADD<0:9> (for example, a maximum value), the detection counter 130 may set the value of the row detection addresses DET_RADD<0:9> to an initial value (for example, a minimum value) and increase the column detection addresses DET_CADD<0:4>.

The flag signal generation unit 140 may toggle to a logic value of a flag signal FLAG in response to the refresh signal REFA in a detection period in which a detection operation is performed. When a detection period signal DET_OP indicating the detection period is activated, the flag signal generation unit 140 may toggle to the logic value of the flag signal FLAG in response to the refresh signal REFA. For example, when the flag signal FLAG has a first logic value (for example, low), the flag signal generation unit 140 may change the flag signal FLAG from the first logic value to a second logic value (for example, high) in response to the refresh signal REFA in the detection period. Furthermore, when the flag signal FLAG has the second logic value, the flag signal generation unit 140 may change the flag signal FLAG from the second logic value to the first logic value in response to the refresh signal REFA in the detection period. During a detection period the row detection addresses DET_RADD<0:9> and the counting addresses CNT_ADD<0:9> may be substantially equal.

The error detection unit 150 may detect and correct errors of selected memory cells corresponding to the row detection addresses DET_RADD<0:9> and/or the column detection addresses DET_CADD<0:4>. In a period in which the flag signal FLAG has a first logic value and the detection period signal DET_OP has been activated, the error detection unit 150 may latch data read from the selected memory cells, in response to the refresh signal REFA. Furthermore, in a period in which the flag signal FLAG has a second logic value and the detection period signal DET_OP has been activated, the error detection unit 150 may compare data read from the selected memory cells, with the latched data and detect any errors in response to the refresh signal REFA.

The fall detection unit 150 may control the first sub-operation to be performed in a first detection period in which the flag signal FLAG has a first logic value. The fail detection unit 150 may control the second sub-operation to be performed in a second detection period in which the flag signal FLAG has a second logic value. The error detection unit 150 may generate the detection period signal DET_OP when the counting addresses CNT_ADD<0:9> and the row detection addresses DET_RADD<0:9> are substantially equal.

When the read data and the latched data are substantially equal to each other, the error detection unit 150 may determine the states of the selected memory cells to be a pass (no fail). When the read data and the latched data are different from each other, the error detection unit 150 may determine the states of the selected memory cells to be a fail. When the states of the selected memory cells are determined to be a fail, the error detection unit 150 may control the column circuit 180 so that the latched data may be written in the selected memory cells (a write-back operation). When no error is detected, the error detection unit 150 may deactivate (for example, low) a detection signal DET. When an error is detected, the error detection unit 150 may activate (for example, high) the detection signal DET.

The refresh control unit 160 may activate the refresh signal REFA when a refresh command REF is received.

The row circuit 170 may be a circuit for controlling active and precharge operations of word lines selected by row addresses RADD<0:9>, the counting addresses CNT_ADD<0:9>, or the row detection addresses DET_RADD<0:9>. The row circuit 170 may activate word lines corresponding to the row addresses RADD<0:9> in response to an active signal ACT activated when an active command is inputted. The row circuit 17 may precharge the activated word lines in response to a precharge signal PRE activated when a precharge command is inputted. Furthermore, when the refresh signal REFA is activated, the row circuit 170 may activate/precharge word lines corresponding to the counting addresses CNT_ADD<0:9>.

The column circuit 180 may read data DATA from memory cells MC coupled to bit lines selected by column addresses CADD<0:4> in response to a read signal RD activated when a read command is inputted. The column circuit 180 may write the data DATA to the memory cells MC in response to a write signal WT activated when a write command is inputted. The data DATA may be inputted/outputted to/from the cell array 110 through the column circuit 180.

Since the values of the counting addresses CNT_ADD<0:9> and the row detection addresses DET_RADD<0:9> are substantially equal in the detection period, the word lines corresponding to the counting addresses CNT_ADD<0:9> in the detection period correspond to the row detection addresses DET_RADD<0:9>.

When the flag signal FLAG has the first logic value and the detection period signal DET_OP has been activated, the column circuit may transmit data of the memory cells corresponding to the row detection addresses DET_RADD<0:9> and the column detection addresses DET_CADD<0:4> to the error detection unit 150 in response to the refresh signal REFA. When the flag signal FLAG has the second logic value and the detection period signal DET_OP has been activated, the column circuit 180 may transmit the data of the memory cells corresponding to the row detection addresses DET_RADD<0:9> and the column detection addresses DET_CADD<0:4> to the error detection unit 150 in response to the refresh signal REFA, and write data transmitted from the fail detection unit 150 in the memory cells corresponding to the row detection addresses DET_RADD<0:9> and the column detection addresses DET_CADD<0:4> in response to the detection signal DET.

A reference numeral 101 indicates a plurality of lines for transferring various signals between the error detection unit 150 and the column circuit 180. In the embodiment of FIG. 1, four bit lines may be selected at a time in response to the column addresses CADD<0:4> or the column detection addresses DET_CADD<0:4>.

When the counting addresses CNT_ADD<0:9> and the row detection addresses DET_RADD<0:9> are substantially equal to each other, the memory device may perform the first sub-operation or the second sub-operation with respect to the memory cells corresponding to the row detection addresses DET_RADD<0:9> and the column detection addresses DET_CADD<0:4> in response to the refresh signal REFA. At this time, the flag signal FLAG decide whether the memory device performs the first sub-operation or the second sub-operation. The first sub-operation and the second sub-operation are performed depending on the logic value of the flag signal FLAG. After the first and second sub-operations are performed, the logic value of the flag signal FLAG is changed, so that the memory device may be controlled to perform the first sub-operation and the second sub-operation alternately.

Figure 2:
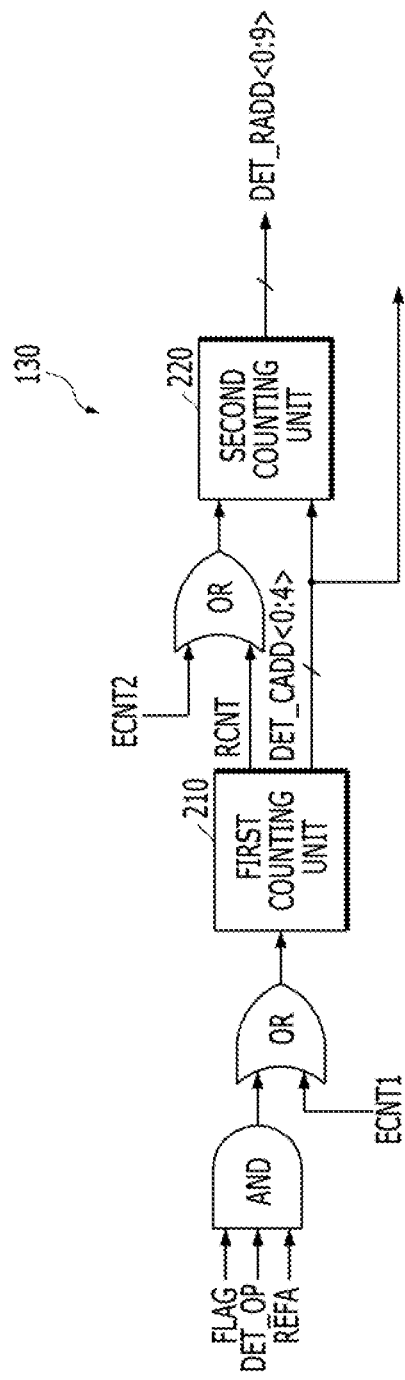
FIG. 2 is a configuration diagram of a detection counter for a memory device shown in FIG. 1, according to an embodiment of the present invention.

FIG. 2 is a configuration diagram of an example of a detection counter 130, that may be employed with a memory device, according to an embodiment.

Referring to FIG. 2, the detection counter 130 may include a first counting unit 210 and a second counting unit 220.

The first counting unit 210 may count the column detection addresses DET_CADD<0:4> (for example, increase the column detection addresses DET_CADD<0:4> by 1) whenever the detection operation is completed. When the detection operation is completed at the end value of the column detection addresses DET_CADD<0:4> (for example, 11111), the first counting unit 210 may initialize the column detection addresses DET_CADD<0:4> to an initial value (for example, 00000) and activate a row counting signal RCNT. To this end, in a state in which the flag signal FLAG has the second logic value and the detection period signal DET_OP has been activated, the first counting unit 210 may count the column detection addresses DET_CADD<0:4> as the refresh signal REFA is activated. Furthermore, in a state in which the flag signal FLAG has the second logic value, and the detection period signal DET_OP has been activated at the end value of the column detection addresses DET_CADD<0:4>, the first counting unit 210 may initialize the column detection addresses DET_CADD<0:4> to an initial value as the refresh signal REFA is activated. In addition, when a first external counting signal ECNT1 is activated, the first counting unit may count the column detection addresses DET_CADD<0:4>. The first external counting signal ECNT1 may be a signal which is used when counting the column detection addresses DET_CADD<0:4> regardless of the completion of the detection operation.

The second counting unit 220 may count the row detection addresses DET_RADD<0:9> (for example, increase the row detection addresses DET_RADD<0:9> by 1) whenever the row counting signal RCNT is activated. When the row counting signal RCNT is activated at the end value of the row detection addresses DET_RADD<0:9> (for example, 1111111111), the second counting unit 220 may initialize the row detection addresses DET_RADD<0:9> to an initial value (for example, 0000000000). In addition, when a second external counting signal ECNT2 is activated, the second counting unit 220 may count the row detection addresses DET_RADD<0:9>. The second external counting signal ECNT2 may be a signal used when counting the row detection addresses DET_RADD<0:9> regardless of the initialization of the column detection addresses DET_CADD<0:4>.

Figure 3:
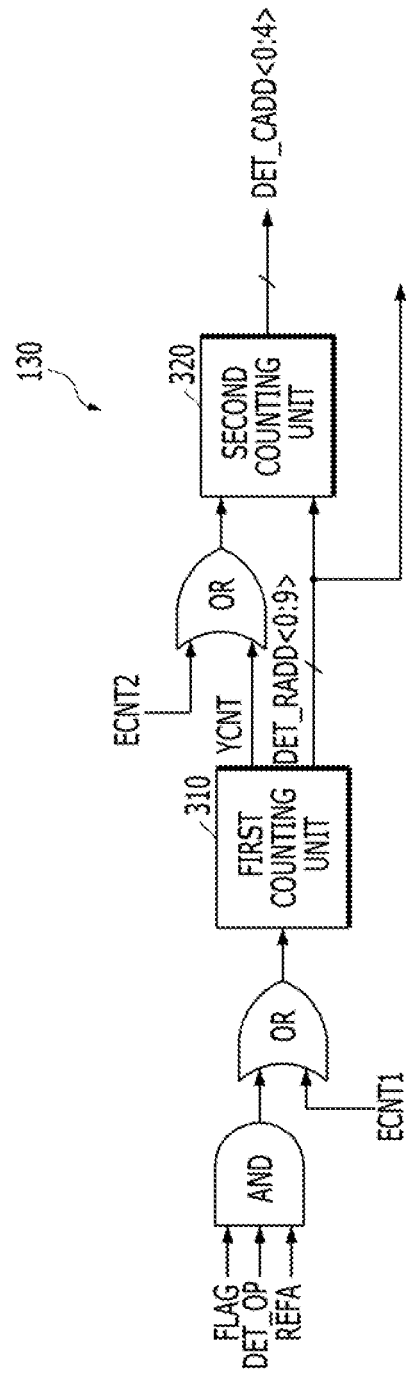
FIG. 3 is a configuration diagram of a detection counter for a memory device shown in FIG. 1, according to another embodiment of the present invention.

FIG. 3 is a configuration diagram of the detection counter 130, according to another embodiment of the invention.

Referring to FIG. 3, the detection counter 130 may include a first counting unit 310 and a second counting unit 320.

The first counting unit 310 may count the row detection addresses DET_RADD<0:9> (for example, increase the row detection addresses DET_RADD<0:9> by 1) when the detection operation is completed. For example, when the detection operation is completed at the end of the row detection addresses DET_RADD<0:9> (for example, 1111111111), the first counting unit 310 may initialize the row detection addresses DET_RADD<0:9> to an initial value (for example, 0000000000) and activate a column counting signal YCNT. To this end, in a state in which the flag signal FLAG has the second logic value and the detection period signal DET_OP has been activated, the first counting unit 310 may count the row detection addresses DET_RADD<0:9> as the refresh signal REFA is activated. Furthermore, in a state in which the flag signal FLAG has the second logic value, and the detection period signal DET_OP has been activated at the end value of the row detection addresses DET_RADD<0:9>, the first counting unit 310 may initialize the row detection addresses DET_RADD<0:9> to an initial value as the refresh signal REFA is activated.

In addition, when a first external counting signal ECNT1 is activated, the first counting unit 310 may count the row detection addresses DET_RADD<0:9>. The first external counting signal ECNT1 may be a signal which is used when counting the row detection addresses DET_RADD<0:9> regardless of the completion of the detection operation.

The second counting unit 320 may count the column detection addresses DET_CADD<0:4> (for example, increase the column detection addresses DET_CADD<0:4> by 1) whenever the column counting signal YCNT is activated. When the column counting signal YCNT is activated at the end value of the column detection addresses DET_CADD<0:4> (for example, 11111), the second counting unit 320 may initialize the column detection addresses DET_CADD<0:4> to an initial value (for example, 00000). In addition, when a second external counting signal ECNT2 is activated, the second counting unit may count the column detection addresses DET_CADD<0:4>. The second external counting signal ECNT2 may be a signal which is used when counting the column detection addresses DET_CADD<0:4> regardless of the initialization of the row detection addresses DET_RADD<0:9>.

Figure 4:
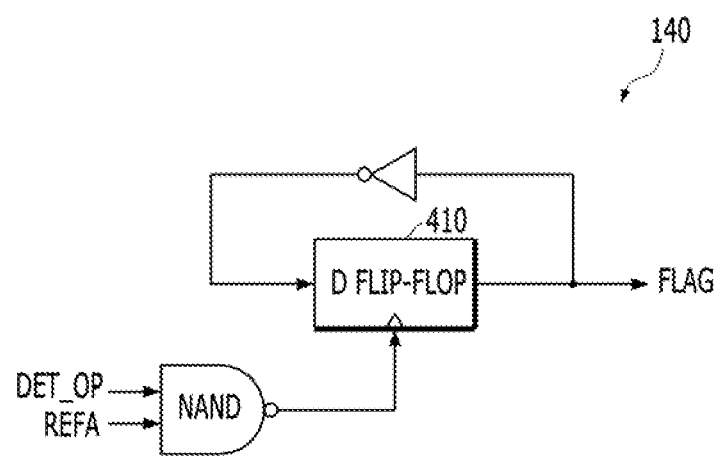
FIG. 4 is a configuration diagram of a flag signal generation unit for a memory device shown in FIG. 1, according to an embodiment of the present invention.

FIG. 4 is a configuration diagram of an example of a flag signal generation unit 140 that may be employed with a memory device, according to an embodiment of the invention.

Referring to FIG. 4, the flag signal generation unit 140 may include a D flip-flop 410.

The D flip-flop 410 may output the flag signal FLAG to be low in an initial state. The flag signal FLAG outputted from the D flip-flop may be inverted and may be inputted to the D flip-flop 410 again.

In a state in which the detection period signal DET_OP has been activated, the D flip-flop 410 may latch an inputted signal and output the flag signal FLAG as the refresh signal REFA is activated. Accordingly, when the detection period signal DET_OP and the refresh signal REFA are activated in a state in which the flag signal FLAG is low, the flag signal FLAG may be changed to high. When the detection period signal DET_OP and the refresh signal REFA are activated in a state in which the flag signal FLAG is high, the flag signal FLAG may be changed to low.

Figure 5:
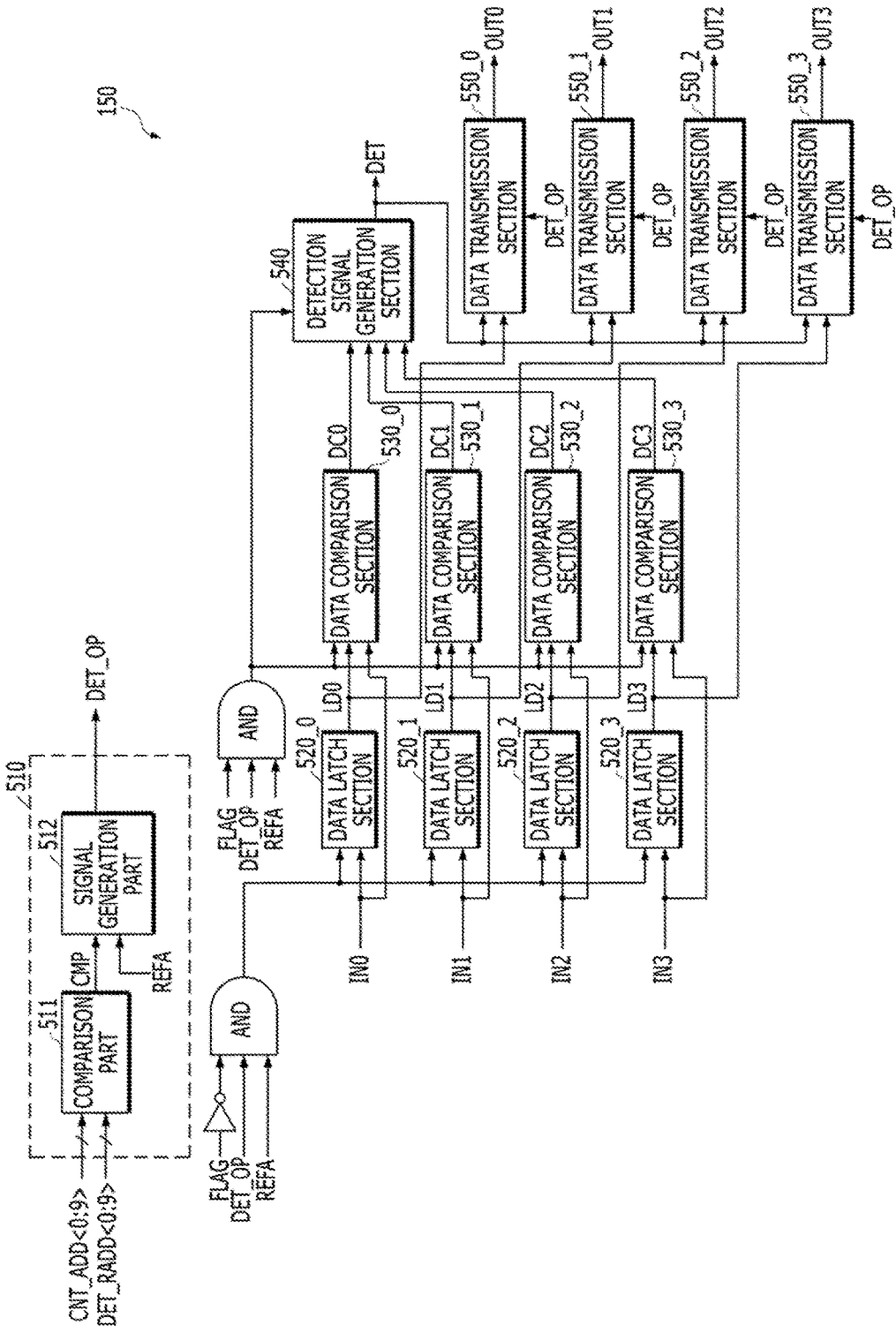
FIG. 5 is a configuration diagram of an error detection unit for a memory device shown in FIG. 1, according to an embodiment of the present invention.

FIG. 5 is a configuration diagram of an error detection unit 150 that may be used with a memory device, according to an embodiment of the invention.

Referring to FIG. 5, the error detection unit 150 may include a detection period signal generation section 510, a plurality of data latch sections 520_0 to 520_3, a plurality of data comparison sections 530_0 to 530_3, a detection signal generation section 540, and a plurality of data transmission sections 550_0 to 550_3. Reference numerals IN0 to IN3 denote input lines through which data is transferred to be inputted to the error detection unit 150, and reference numerals OUT0 to OUT3 denote output lines through which data is transferred to be outputted from the error detection unit 150. The lines 101 of FIG. 1 may include the input lines IN0 to IN3 and the output lines OUT0 to OUT3.

The detection period signal generation section 510 may include a comparison part 511 and a signal generation part 512. The comparison part 511 may compare the counting addresses CNT_ADD<0:9> with the row detection addresses DET_RADD<0:9>, deactivate (for example, low) a comparison signal CMP when they are not substantially equal, and activate (for example, high) the comparison signal CMP when they are substantially equal. The signal generation part 512 may activate the detection period signal DET_OP when the comparison signal CMP is activated, and may deactivate the detection period signal DET_OP in response to the refresh signal REFA in a state in which the comparison signal CMP has been activated.

The plurality of data latch sections 520_0 to 520_3 respectively correspond to the input lines IN0 to IN3, and may latch data, which has been transferred to the respective input lines IN) to IN3, in response to the refresh signal REFA when the flag signal FLAG has the first logic value and the detection period signal DET_OP has been activated. Data of the input lines IN0 to IN3 may be data firstly read from selected memory cells MC. The plurality of data latch sections 520_0 to 520_3 may output the latched data (LD0 to LD3).

The plurality of data comparison sections 530_0 to 530_3 may output results DC0 to DC3, which have been obtained by comparing the latched data LD0 to LD3 outputted from the respective data latch sections 520_0 to 520_3 with data transferred to the respective input lines IN) to IN3, in response to the refresh signal REFA when the flag signal FLAG has the second logic value and the detection period signal DET_OP has been activated. The data comparison sections 530_0 to 530_3 may deactivate the result DC0 to DC3 (for example, low) when the latched data LD0 to LD3 are substantially equal to data of the input lines IN0 to IN3, and may activate the results DC0 to DC3 (for example, high) when the latched data LD0 to LD3 are different from the data of the input lines IN0 to IN3.

The detection signal generation section 540 may deactivate the detection signal DET in response to the refresh signal REFA when all the results DC0 to DC3 are deactivated, that is, when the firstly read data (the latched data LD0 to LD3) is substantially equal to the secondly read data (the data of the input lines IN0 to IN3) in the case in which the flag signal FLAG has the second logic value and the detection period signal DET_OP has been activated. Furthermore, in the case in which the flag signal FLAG has the second logic value and the detection period signal DET_OP has been activated, the detection signal generation section 540 may activate the detection signal DET in response to the refresh signal REFA, when one or more signals of the results DC0 to the DC3 are activated, that is, when the firstly read data is different from the secondly read data.

The plurality of data transmission sections 550_0 to 550_3 may respectively transfer the data LD0 to LD3, which have been outputted from the data latch sections 520_0 to 520_3, respectively, to the output lines OUT0 to OUT3 when the detection signal DET is activated in the case in which the flag signal FLAG has the second logic value and the detection period signal DET_OP has been activated. The data transferred to the output lines OUT0 to OUT3 may be written in the selected memory cells MC via the column circuit 180. At this time, a write-back operation may be performed after pass/fail determination of the selected memory cells is completed.

Figure 6:
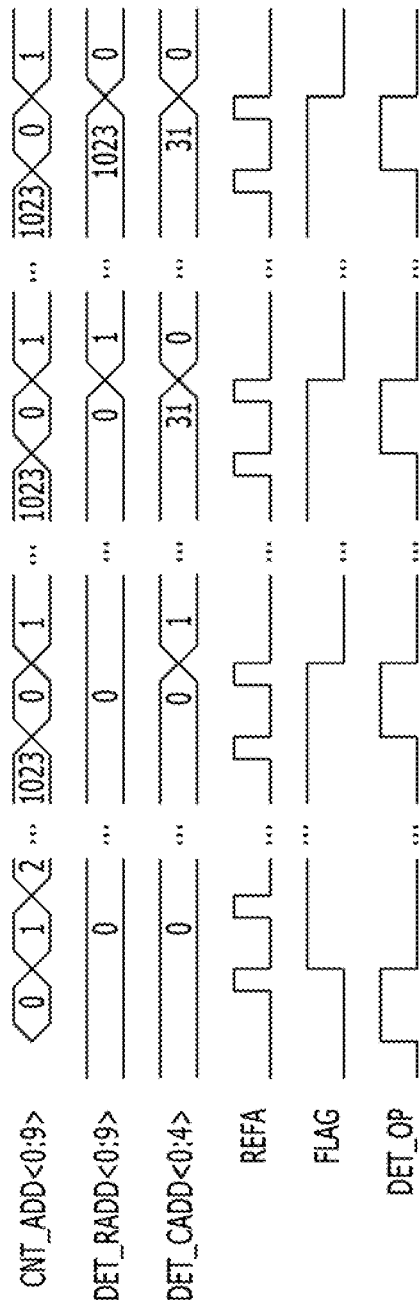
FIG. 6 is a timing diagram illustrating an operation of the memory device of FIG. 1 employing the detection counter 130 of FIG. 2, according to an embodiment of the present invention.

FIG. 6 is a diagram illustrating the operation of a memory device employing the detection counter 130 of FIG. 2, according to an embodiment of the invention. Hereinafter, the counting addresses CNT_ADD<0:9>, the row detection addresses DET_RADD<0:9>, and the column detection addresses DET_CADD<0:4> are expressed by decimal numbers.

Referring to FIG. 6, in the memory device, all the counting addresses CNT_ADD<0:9>, the row detection addresses DET_RADD<0:9>, and the column detection addresses DET_CADD<0:4> are 0 in an initial state. The flag signal FLAG is low in an initial state.

Since the counting addresses CNT_ADD<0:9> and the row detection addresses DET_RADD<0:9> are 0, the detection period signal DET_OP becomes high. When the refresh command REF is received and the refresh signal REFA is activated, the first-sub operations of memory cells corresponding to the row detection addresses DET_RADD<0:9>=0 and the column detection addresses DET_CADD<0:4>=0 are performed. Since both the detection period signal DET_OP and the refresh signal REFA have been activated in the low state of the flag signal FLAG, the flag signal FLAG may become high.

Since the counting addresses CNT_ADD<0:9> and the row detection addresses DET_RADD<0:9> are different from each other in a period of the counting addresses CNT_ADD<0:9> from 1 to 1023, the detection period signal DET_OP may become low, so that no detection operation is performed even though the refresh signal REFA is activated. When the counting addresses CNT_ADD<0:9> are counted and are substantially equal to the row detection addresses DET_RADD<0:9> again, the detection period signal DET_OP becomes high. And then, when the refresh signal REFA is activated, the second-sub operations of the memory cells corresponding to the row detection addresses DET_RADD<0:9>=0 and the column detection addresses DET_CADD<0:4>=0 are performed. When the second-sub operations are completed, the column detection addresses DET_CADD<0:4> are may be increased from 0 to 1 and then the detection operations of memory cells corresponding to the row detection addresses DET_RADD<0:9>=0 and the column detection addresses DET_CADD<0:4>=1 are performed.

After the detection operations of memory cells corresponding to the row detection addresses DET_RADD<0:9>=0 and the column detection addresses DET_CADD<0:4>=1 to 31 are sequentially performed, the row detection addresses DET_RADD<0:9> are may be increased from 0 to 1. The detection operations of memory cells coupled to word lines corresponding to the row detection addresses DET_RADD<0:9>=1 to 1023 may be performed with processes similar to the above. When the detection operations of memory cells corresponding to the row detection addresses DET_RADD<0:9>=1023 and the column detection addresses DET_CADD<0:4>=31 are completed, detection operations may be repeated from the memory cells corresponding to the row detection addresses DET_RADD<0:9>=0 and the column detection addresses DET_CADD<0:4>=0.

Figure 7:
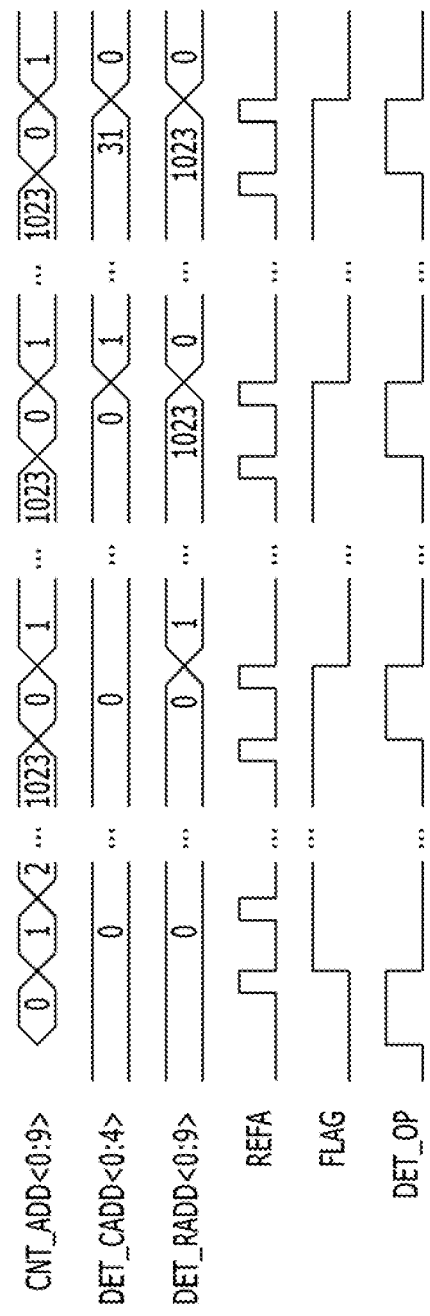
FIG. 7 is a timing diagram illustrating an operation of the memory device of FIG. 1 employing the detection counter 130 of FIG. 3, according to another embodiment of the present invention.

FIG. 7 is a timing diagram illustrating an operation of the memory device of FIG. 1. More specifically, FIG. 7 illustrates the operation of a memory device employing the detection counter 130 of FIG. 3, according to an embodiment of the invention.

Hereinafter, the counting addresses CNT_ADD<0:9>, the row detection addresses DET_RADD<0:9>, and the column detection addresses DET_CADD<0:4> are expressed by decimal numbers.

Referring to FIG. 7, in the memory device, all the counting addresses CNT_ADD<0:9>, the row detection addresses DET_RADD<0:9>, and the column detection addresses DET_CADD<0:4> are 0 in an initial state. The flag signal FLAG is low in an initial state.

Since the counting addresses CNT_ADD<0:9> and the row detection addresses DET_RADD<0:9> are 0, the detection period signal DET_OP becomes high. When the refresh command REF is received and the refresh signal REFA is activated, the first-sub operations of memory cells corresponding to the row detection addresses DET_RADD<0:9>=0 and the column detection addresses DET_CADD<0:4>=0 may be performed. Since both the detection period signal DET_OP and the refresh signal REFA have been activated in the low state of the flag signal FLAG, the flag signal FLAG may become high.

Since the counting addresses CNT_ADD<0:9> and the row detection addresses DET_RADD<0:9> are different from each other in a period of the counting addresses CNT_ADD<0:9> from 1 to 1023, the detection period signal DET_OP may become low, so that no detection operation is performed even though the refresh signal REFA is activated. When the counting addresses CNT_ADD<0:9> are counted and are substantially equal to the row detection addresses DET_RADD<0:9> again, the detection period signal DET_OP becomes high. And then, when the refresh signal REFA is activated, the second-sub operations of the memory cells corresponding to the row detection addresses DET_RADD<0:9>=0 and the column detection addresses DET_CADD<0:4>=0 are performed. When the second-sub operations are completed, the row detection addresses DET_RADD<0:9> may be increased from 0 to 1 and then the detection operations of memory cells corresponding to the row detection addresses DET_RADD<0:9>=1 and the column detection addresses DET_CADD<0:4>=0 may be performed.

After the detection operations of memory cells corresponding to the row detection addresses DET_RADD<0:9>=0 to 1023 and the column detection addresses DET_CADD<0:4>=0 are sequentially performed, the column detection addresses DET_CADD<0:4> may be increased from 0 to 1. The detection operations of memory cells coupled to bit lines corresponding to the column detection addresses DET_CADD<0:4>=1 to 31 may be performed in an order similar to the above. When the detection operations of memory cells corresponding to the row detection addresses DET_RADD<0:9>=1023 and the column detection addresses DET_CADD<0:4>=31 are completed, detection operations may be repeated from the memory cells corresponding to the row detection addresses DET_RADD<0:9>=0 and the column detection addresses DET_CADD<0:4>=0.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
  a plurality of memory cells;
  a flag signal generation unit including one or more logic circuits suitable for generating a flag signal with a logic value which toggles between first and second logic values in response to a refresh command in a detection period; and
  an error detection unit including one or more data latch circuits, one or more data comparison circuits and a detection signal generation circuit,
  wherein the one or more data latch circuits are suitable for latching data read a first time from at least one selected memory cell of the plurality of memory cells in the detection period,
  wherein the one or more data comparison circuits are suitable for comparing data read a second time from the at least one selected memory cell with the latched data,
  wherein the detection signal generation circuit is suitable for detecting an error of the at least one selected memory cell in the detection period, and wherein when an error is detected, the at least one selected memory cell is determined to be a fail, and the error detection unit controls the latched data to be written to the at least one selected memory cell.

2. The memory device of claim 1, wherein when no error is detected, the error detection unit determines the at least one selected memory cell to be a pass.

3. The memory device of claim 1, wherein the error detection unit latches data read from the at least one selected memory cell in the detection period when the flag signal has a first logic value, and compares data read from the at least one selected memory cell in the detection period when the flag signal has a second logic value.

4. The memory device of claim 1, further comprising:
a refresh control unit including one or more logic circuits suitable for controlling one or more memory cells of the plurality of memory cells corresponding to a refresh address to be refreshed in response to a refresh command.

5. The memory device of claim 1, wherein the error detection unit sequentially selects the at least one selected memory cell from the plurality of memory cells for detecting an error thereof.

6. The memory device of claim 1:
wherein a column detection address is changed when an operation for detecting an error of the at least one selected memory cell is completed, and a row detection address is changed when the column detection address is changed from an end value to an initial value; and
wherein the error detection unit detects an error of the at least one selected memory cell corresponding to the row detection address and the column detection address among the plurality of memory cells.

7. The memory device of claim 1:
wherein a row detection address is changed when an operation for detecting the error of the at least one selected memory cell is completed, and a column detection address is changed when the row detection address is changed from an end value to an initial value; and
wherein the error detection unit detects an error of the at least one selected memory cell corresponding to the row detection address and the column detection address among the plurality of memory cells.

8. A memory device comprising:
a plurality of memory cells;
a refresh counter suitable for generating a refresh address;
a detection counter suitable for generating row and column detection addresses;
a flag signal generation unit including one or more logic circuits suitable for generating a flag signal with a logic value which toggles in response to a refresh command in a detection period when the refresh address and the row detection address are equal to each other; and
an error detection unit including one or more data latch circuits, one or more data comparison circuits and a detection signal generation circuit,
wherein the one or more data latch circuits are suitable for latching data of memory cells, which are selected by the row and column detection addresses from the plurality of memory cells, in response to the refresh command when the flag signal has a first logic value and the refresh address and the row detection address are equal to each other,
wherein the one or more data comparison circuits are suitable for comparing data of the selected memory cells with the latched data,
wherein the detection signal generation circuit is suitable for detecting errors of the selected memory cells in response to the refresh command when the flag signal has a second logic value and the refresh address and the row detection address are equal to each other, and
wherein, when the selected memory cells are determined to be fails, the error detection unit controls the latched data to be written in the selected memory cells.

9. The memory device of claim 8, wherein, when the latched data is different from the data of the selected memory cells, the error detection unit determines the selected memory cells to be fails, and when the latched data is equal to the data of the selected memory cells, the error detection unit determines the selected memory cells to be passes.

10. The memory device of claim 8, further comprising:
a refresh control unit including one or more logic circuits suitable for controlling a memory cell of the plurality of memory cells corresponding to the refresh address to be refreshed in response to the refresh command,
wherein the refresh counter counts the refresh address in response to the refresh command.

11. The memory device of claim 8, wherein the detection counter changes the column detection address when an operation for detecting the errors of the selected memory cells is completed, and changes the row detection address when the column detection address is changed from an end value to an initial value.

12. The memory device of claim 8, wherein the detection counter changes the row detection address when an operation for detecting the errors of the selected memory cells is completed, and changes the column detection address when the row detection address is changed from an end value to an initial value.

13. The memory device of claim 8, wherein the error detection unit sequentially selects the selected memory cells and detects errors thereof.

14. The memory device of claim 8:
wherein the error detection unit activates a detection period signal when the refresh address and the row detection address become equal and deactivates the detection period signal in response to the refresh command in the detection period; and
wherein the flag signal generation unit changes the logic value of the flag signal in response to the refresh command in an activation period of the detection period signal.

15. The memory device of claim 14, wherein the detection counter changes the column detection address in response to the refresh command when the flag signal has the second logic value in the activation period of the detection period signal, and changes the column detection address to an initial value and changes the row detection address when the column detection address has an end value.

16. The memory device of claim 15, wherein the detection counter changes the row detection address in response to the refresh command when the flag signal has the second logic value in the activation period of the detection period signal, and changes the row detection address to an initial value and changes the column detection address when the row detection address has an end value.

\* \* \* \* \*